United States Patent [19]
Livingston

[11] 3,933,481
[45] Jan. 20, 1976

[54] HIGH-TEMPERATURE EUTECTOID ALLOY AND PROCESS OF MAKING

[75] Inventor: James D. Livingston, Scotia, N.Y.

[73] Assignee: General Electric Company, Schenectady, N.Y.

[22] Filed: Mar. 21, 1974

[21] Appl. No.: 453,283

[52] U.S. Cl. .................................. 75/135; 75/170
[51] Int. Cl.² ........................................ C22C 19/02
[58] Field of Search .................. 75/170, 135, 652 M

[56] References Cited
UNITED STATES PATENTS
3,694,193   9/1972   Carpay et al. .................... 75/170

*Primary Examiner*—M. J. Andrews
*Attorney, Agent, or Firm*—Jane M. Binkowski; Joseph T. Cohen; Jerome C. Squillaro

[57] ABSTRACT

A continuous process for producing novel aligned composites of a Co-Si eutectoid type alloy having significant tensile strength is provided. The process comprises forming a melt of a $Co_{3-x}M_xSi_{1-y}N_y$ alloy where M represents certain elements substituting for Co and $x$ has a value ranging up to 0.6, where N represents certain elements substituting for Si and $y$ has a value ranging up to 0.2, unidirectionally cooling said melt through a thermal gradient at a velocity which produces a solid having elongated columnar macro-grains aligned substantially parallel to each other, and unidirectionally cooling said macro-grain solid through said thermal gradient at said velocity which on reaching transformation temperature directionally transforms said solid into an aligned solid composite consisting essentially of at least two phases, the ratio of said thermal gradient to said velocity being greater than $150°C/cm^2/hr$. The phases are in the form of substantially uniform alternating lamellae parallel to each other and have an average interlamellar spacing less than 3 microns. The composite is substantially or completely free of dendrites.

4 Claims, 1 Drawing Figure

U.S. Patent   Jan. 20, 1976   3,933,481
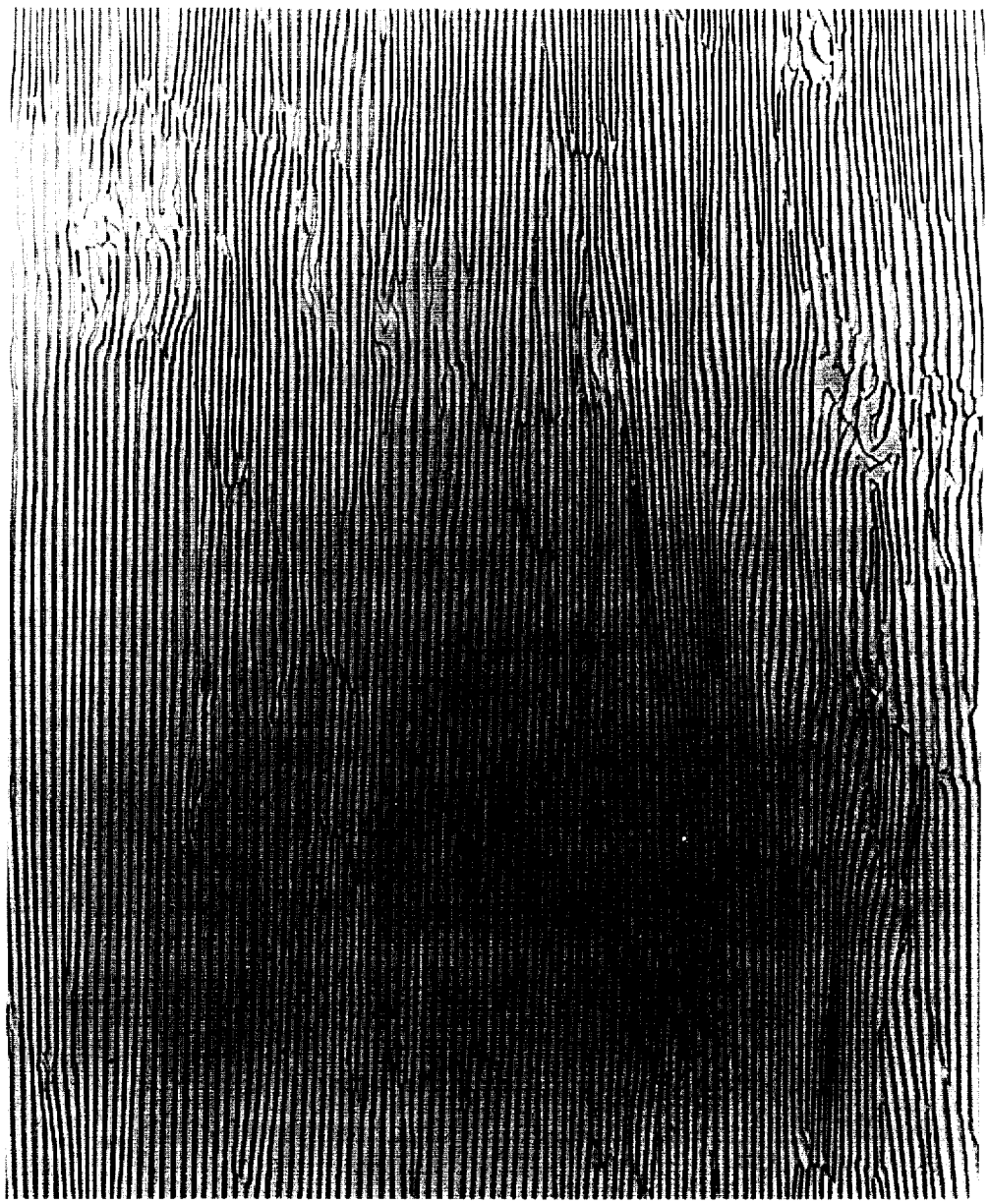

HIGH-TEMPERATURE EUTECTOID ALLOY AND PROCESS OF MAKING

The invention described herein was made in the course of, or under, a contract with the Naval Air Systems Command.

The present invention relates generally to the art of directional control of eutectoid decomposition of metal alloys, and particularly, it relates to a process for producing novel directional composites of Co-Si eutectoid alloy and higher-order alloys thereof.

The art has disclosed the directional transformation of certain eutectoid alloys to produce aligned composite structures. These transformations are normally accomplished by moving the alloy sample through a thermal gradient at a certain rate. Specifically, directional transformation of a eutectoid alloy is carried out by cooling from the high temperature single phase solid of the alloy through the temperature at which decomposition or transformation into at least two solid phases occurs. However, such normal transformation of the $Co_3Si$ eutectoid alloy has produced only aligned microstructures containing significant amounts of dendrites with poor tensile properties.

The present invention provides a process of producing novel aligned composites from a $Co_3Si$ eutectoid alloy or higher-order alloys thereof having substantial tensile strength at elevated temperatures of the order of 900°C making them useful for a wide range of applications. The composite consists essentially of a two phase substantially uniform lamellar microstructure substantially or completely free of dendrites. The process includes continuous unidirectional cooling of the alloy melt to the aligned solid composite through the same thermal gradient at the same rate.

The invention will be better understood from the following description taken in conjunction with the accompanying FIGURE which is a photomicrograph (1,000X) showing a transverse section of an aligned $Co_3Si$ composite of the present invention.

Briefly stated, in one embodiment, the process comprises unidirectionally cooling a melt of the Co-Si eutectoid alloy through a thermal gradient at a velocity which produces a solid having elongated columnar macro-grains aligned substantially parallel to each other, and unidirectionally cooling said macro-grain solid through said thermal gradient at said velocity which on reaching transformation temperature directionally transforms said solid into an aligned solid composite consisting essentially of two phases with one of said phases being a cobalt-rich phase containing silicon in solution in an amount ranging from about 8 to 12 atomic percent and the second said phase being a $Co_2Si$ phase, the ratio of said thermal gradient to said velocity being greater than 150°C/cm²/hr, said phases being in the form of substantially uniform alternating lamellae substantially parallel to each other and to the thermal gradient and having an average interlamellar spacing ranging from 0.5 micron to 3 microns, said composite being substantially or completely free of dendrites.

The cast cobalt-silicon alloy body of the present invention, e.g. the aligned eutectoid composite, consists essentially of two phases and has a lamellar microstructure extending substantially throughout the body. One phase consists essentially of cobalt containing silicon in solution in an amount ranging from about 8 to 12 atomic percent and the second phase is a $Co_2Si$ phase. The lamellae of one phase are arranged in alternate relation to the lamellae of the second phase and the interlamellar spacing is between about 0.5 micron and 3 microns. The lamellae are of substantially uniform size, substantially parallel to each other, and substantially uniformly distributed through the composite. The present aligned composite is substantially or completely free of dendrites and has a minimum tensile strength at 900°C of 50,000 psi in an inert atmosphere.

In the present invention a Co-Si alloy which undergoes a eutectoid decomposition is used. Preferably, the alloy is of $Co_3Si$ eutectoid composition, e.g., Co-25 atomic % Si, but can vary from the eutectoid composition by about 1 atomic %. Co-Si compositions outside this range are not useful since they produce proeutectoid particles which are those portions of the alloy which do not undergo a eutectoid reaction.

In the present process, the thermal gradient usually ranges from 50°C/cm to about 3,000°C/cm. Higher thermal gradients are preferred since they result in a better aligned product and allow the use of higher velocities to achieve a dendrite free product.

The velocity of motion is determinable empirically and depends largely on the particular alloy composition. In the present process, the velocity usually ranges from 0.05 cm/hr to 20 cm/hr. Within this velocity range, the higher velocities result in composites having a finer lamellar structure, e.g., a smaller interlamellar spacing. Velocities higher than 20 cm/hr are not useful since they result in an unaligned composite.

The $Co_3Si$ alloy has a eutectoid decomposition temperature of 1,170°C. Its transformation or decomposition temperature varies with the velocity of motion through the thermal gradient and in the present process ranges from about 1,170°C to 1,120°C with the lower transformation temperatures occurring at higher velocities.

In addition, in the present invention, a number of novel directionally aligned ternary and higher-order alloys based on the Co-Si eutectoid also can be prepared having properties which make them useful as high-temperature structural alloys. Specifically, a number of alloying elements can be partially substituted in the present Co-Si eutectoid alloy without losing or without any significant deterioration of the fine aligned eutectoid microstructure from which these good properties derive. In some instances these alloying elements produce increased strength and, in other instances, increased oxidation resistance. The present invention, therefore, includes alloys of the general formula $Co_{3-x}M_xSi_{1-y}N_y$, where M represents elements substituting for Co and $x$ has a value ranging up to 0.6, and N represents elements substituting for Si and $y$ has a value ranging up to 0.2. M is a member of the group consisting of Ni, Cr, Fe, Mn, Cu, Ta, Mo, W, Ti and alloys thereof. N is a member of the group consisting of Ge, Sn, Al, Ga, In and alloys thereof.

In all instances the alignment of the $Co_{3-x}M_xSi_{1-y}N_y$ alloy in accordance with the present invention produces an aligned composite substantially or completely free of dendrites which has a minimum tensile strength at 900°C of 50,000 psi measured in an inert atmosphere such as argon or a substantial vacuum. Specifically, alignment of the $Co_{3-x}M_xSi_{1-y}N_y$ alloy produces a composite consisting essentially of at least two phases having a substantially uniform lamellar microstructure extending substantially uniformly throughout said composite with interlamellar spacing ranging from 0.2 micron to 3 microns and each phase being alternately arranged with the second or other phases.

In carrying out the process, a melt of the alloy is unidirectionally solidified through a thermal gradient at a fixed velocity to produce a macro-grain solid, e.g., a solid having elongated columnar macro-grains. For best results the average diameter of the macro-grains is larger than about 10 microns. The resulting macro-grain solid is unidirectionally cooled through the same thermal gradient at the same velocity to produce the aligned composite of the present invention. All unidirectional cooling is carried out in an atmosphere in which the alloy is inert such as argon.

Unidirectional cooling to produce the present aligned composite can be carried out by a number of conventional methods which allow passage of the alloy through the thermal gradient in a single direction to cool it at a fixed velocity to the transformation temperature. Alternatively, the thermal gradient can be moved relative to the alloy. Generally, the apparatus is comprised of a heated vertical mold provided with a cooling system at its lower end, means for maintaining the desired thermal gradient and means for pulling the alloy through the thermal gradient at the desired fixed velocity. The rate that the aligned composite is cooled, once it is formed, is not critical.

In the present invention in order that the present aligned lamellar microstructure be produced free of dendrites, the ratio of the thermal gradient G to the velocity of motion V must always be greater than $150°C/cm^2/hr$.

Since the present aligned composite not only has substantial tensile strength at a temperature of 900°C but also significant oxidation resistance and microstructural stability at elevated temperatures, it is particularly useful as a high temperature structural alloy. Examples of such uses include blades or vanes for high-temperature turbines.

The invention is further illustrated by the following examples:

EXAMPLE 1

Using standard procedures a Co-25 atomic % (13.7 wt.%) Si eutectoid alloy, was formed under argon and cast into a rod three-sixteenths inch in diameter and 6 inches long.

The rod was placed in a close-fitting alumina crucible and the resulting assembly placed in a vertical platinum-wound furnace. Using conventional equipment the rod was directionally solidified and directionally decomposed under a nitrogen atmosphere to form an aligned composite. Specifically, the rod was melted under nitrogen and passed through a thermal gradient of 750°C/in or 300°C/cm by pulling it down through a water-cooled copper toroid by a lowering device which maintained it at a fixed velocity of 0.1 in/hr or 0.25 cm/hr. The ratio of the thermal gradient to velocity was $1,200°C/cm^2/hr$.

The resulting aligned rod was sectioned and examined using standard metallographic procedures. It had a substantially uniform microstructure. Specifically, it had two phases, the cobalt-rich phase containing a minor amount of silicon in solution and the $Co_2Si$ phase, in the form of substantially uniform alternating lamellae substantially parallel to each other and to the thermal gradient and an average interlamellar spacing of 2 microns. It appeared to be free of dendrites.

EXAMPLE 2

In this example Co-Si eutectoid alloy rods were prepared, directionally solidified and directionally decomposed to form aligned composites as disclosed in Example 1. Three test bars of the same size were machined from the aligned composites. Each bar appeared to be free of dendrites.

The tensile strength of each bar was determined in a standard manner in a substantial vacuum at elevated temperatures. One test bar had a tensile strength of 62,000 psi at 900°C, the second bar had a tensile strength of 37,000 psi at 1,000°C and the third had a tensile strength of 12,000 psi at 1,100°C.

EXAMPLE 3

A Co-Si eutectoid alloy rod was prepared and directionally solidified and decomposed to form an aligned composite as disclosed in Example 1 except that after about one-half of the rod had been directionally aligned, the rod was quenched in water and its structure examined using standard metallographic procedures. A cross-section of the rod, about ¾ inch thick, had a number of columnar macro-grains with an average diameter larger than 10 microns aligned substantially parallel to each other and to the thermal gradient and distributed substantially uniformly throughout this cross-section. Adjacent to this cross-section, which illustrated that directional solidification took place, was a section which illustrated that directional decomposition took place and which consisted of two phases in the form of substantially uniform alternating lamellae substantially parallel to each other and to the thermal gradient.

EXAMPLE 4

In this example, the oxidation resistance of the aligned composite of the present invention was determined.

A Co-Si eutectoid alloy rod was prepared, directionally solidified and decomposed to form an aligned composite as disclosed in Example 1 except that it had a diameter of ¾ inch. The resulting aligned rod or composite was machined transversely to form two discs about ¾ inch in diameter and about 0.05 inch in thickness.

One disc was placed in an air oven and maintained at 800°C for 48 hours. At the end of this time, it showed a weight gain of 0.55 $mg/cm^2$. The second disc was placed in an air oven and maintained at 1,100°C for 48 hours. It showed a weight gain of 1.3 $mg/cm^2$. These small weight gains illustrate the good oxidation resistance of the present composites at elevated temperatures.

EXAMPLE 5

In this example, the heat stability of the aligned composite of the present invention was determined.

Co-Si eutectoid alloy rods were prepared and directionally solidified and decomposed to form aligned composites as set forth in Example 1.

Two test bars were machined from the aligned composites. Both bars were maintained in a nitrogen atmosphere for about 4 weeks with one bar being held at a temperature of 900°C and the other at 1,000°C. At the end of this time metallographic examination of both bars showed that the fine uniform lamellar microstructure was substantially unchanged.

EXAMPLE 6

A Co-Si eutectoid alloy rod was prepared and directionally solidified and decomposed to form an aligned composite in a manner similar to that disclosed in Example 1 except that the velocity was fixed at 0.25 in/hr or 0.6 cm/hr. The ratio of the thermal gradient to velocity was 500°C/cm²/hr.

A transverse section of the resulting aligned rod was cut, mechanically polished and examined using standard metallographical procedures. The accompanying FIGURE a photomicrograph of this transverse section enlarged 1,000 X, illustrates the substantially uniform microstructure of the aligned composite produced by the present invention. Specifically, it shows two phases consisting of the Co-rich phase containing a minor amount of Si in solution and the Co₂Si phase in the form of substantially uniform alternating lamellae substantial parallel to each other and having an average interlamellar spacing of 1.5 microns.

The aligned composite appeared to be completely free of dendrites.

EXAMPLE 7

In this example, three rods of eutectoid ternary alloys of the composition $Co_{2.85}M_{0.15}Si$ where M was Ni, Cr or Ta, and where M was substituted for 5% of the Co, were prepared, directionally solidified and decomposed to form aligned composites as disclosed in Example 6.

Each aligned composite was sectioned for metallographic examination.

The aligned composite of the Co-Ni-Si eutectoid alloy was substantially uniform in microstructure and consisted of two phases in the form of alternating lamellae substantially parallel to each other and to the thermal gradient. It appeared to have an average interlamellar spacing of less than 1 micron.

The aligned composite of the Co-Cr-Si eutectoid alloy had a two phase alternating lamellae microstructure.

The aligned composite of the Co-Ta-Si eutectoid alloy, in addition to having an aligned two phase lamellar microstructure, appeared to have a third phase distributed substantially uniformly therein.

All of these composites appeared to be free of dendrites, and it is to be expected that, due to the presence of Ni, Cr or Ta, they will have increased resistance to oxidation and improved mechanical properties.

What is claimed is:

1. A process for producing an aligned solid composite of a Co-Si eutectoid type alloy having a minimum tensile strength at 900°C of 50,000 psi in an inert atmosphere, said alloy having a transformation temperature at which it transforms from a single phase solid to a solid of at least two phases, which comprises forming a melt of a $Co_{3-x}M_xSi_{1-y}N_y$ alloy where Co and Si can vary from the Co₃Si eutectoid composition by about 1 atomic %, where M represents elements substituting for Co and is a member of the group consisting of Ni, Cr, Fe, Mn, Cu, Ta, Mo, W, Ti and alloys thereof and where x ranges up to about 0.6, where N represents elements substituting for Si and is a member of the group consisting of Ge, Sn, Al, Ga, In and alloys thereof and where y ranges up to about 0.2, unidirectionally cooling said melt through a thermal gradient ranging from 50°C/cm to 3,000°C/cm at a velocity ranging from 0.05 cm/hr to 20 cm/hr which produces a single phase solid consisting essentially of elongated columnar macro-grains aligned substantially parallel to each other before reaching said transformation temperature, said macro-grains having an average diameter larger than 10 microns, and continuing unidirectionally cooling said macro-grain solid through the same thermal gradient at the same velocity through said transformation temperature directionally transforming said single phase solid into an aligned solid composite consisting essentially of at least two phases, the ratio of said thermal gradient to said velocity being greater than 150°C/cm²/hr, said phases being in the form of substantially uniform alternating lamellae substantially parallel to each other and to the thermal gradient and having an average interlamellar spacing ranging from about 0.2 micron to 3 microns and being substantially uniformly distributed throughout said composite, said composite being substantially or completely free of dendrites.

2. A process according to claim 1 wherein said alloy consists of a Co-Si eutectoid alloy, and wherein said aligned solid composite consists essentially of two phases with one of said phases being a cobalt-rich phase containing silicon in solution in an amount ranging from about 8 to 12 atomic percent and the second said phase being a Co₂Si phase, and wherein said average interlamellar spacing ranges from 0.5 micron to 3 microns.

3. An aligned solid composite of a Co-Si eutectoid type alloy having a minimum tensile strength at 900°C of 50,000 psi in an inert atmosphere and having the general formula $Co_{3-x}M_xSi_{1-y}N_y$ where Co and Si can vary from the Co₃Si eutectoid composition by about 1 atomic %, where M represents elements substituting for Co and is a member of the group consisting of Ni, Cr, Fe, Mn, Cu, Ta, Mo, W, Ti and alloys thereof and where x ranges up to about 0.6, where N represents elements substituting for Si and is a member of the group consisting of Ge, Sn, Al, Ga, In and alloys thereof and where y ranges up to about 0.2, said aligned solid composite consisting essentially of at least two phases, said phases being distributed uniformly throughout said composite in the form of substantially uniform alternating lamellae substantially parallel to each other and having an average interlamellar spacing ranging from about 0.2 micron to 3 microns, said composite being substantially or completely free of dendrites and being produced by a process which comprises forming a melt of said eutectoid type alloy, said alloy having a transformation temperature at which it transforms from a single phase solid to a solid of at least two phases, unidirectionally cooling said melt through a thermal gradient ranging from 50°C/cm to 3,000°C/cm at a velocity ranging from 0.05 cm/hr to 20 cm/hr which produces a single phase solid consisting essentially of elongated columnar macro-grains aligned substantially parallel to each other before reaching said transformation temperature, said macro-grains having an average diameter larger than 10 microns, and continuing unidirectionally cooling said macro-grain solid through the same thermal gradient at the same velocity through said transformation temperature directionally transforming said single phase solid into said aligned solid composite consisting essentially of at least two phases, the ratio of said thermal gradient to said velocity being greater than 150°C/cm²/hr, said phases being substantially parallel to the thermal gradient.

4. An aligned solid composite according to claim 3 wherein said alloy consists of a Co-Si eutectoid alloy, and wherein said aligned composite consists essentially of two phases, with one of said phases being a cobalt-rich phase containing silicon in solution in an amount ranging from about 8 to 12 atomic percent and the second said phase being a $Co_2Si$ phase, and wherein said average interlamellar spacing ranges from 0.5 micron to 3 microns.

* * * * *